United States Patent [19]

Tatematsu

[11] Patent Number: 4,473,895

[45] Date of Patent: Sep. 25, 1984

[54] SEMICONDUCTOR MEMORY DEVICE

[75] Inventor: Takeo Tatematsu, Yokohama, Japan

[73] Assignee: Fujitsu Limited, Kawasaki, Japan

[21] Appl. No.: 237,127

[22] PCT Filed: Jun. 14, 1980

[86] PCT No.: PCT/JP80/00132

§ 371 Date: Feb. 15, 1981

§ 102(e) Date: Feb. 13, 1981

[87] PCT Pub. No.: WO80/02889

PCT Pub. Date: Dec. 24, 1980

[30] Foreign Application Priority Data

Jun. 15, 1979 [JP] Japan .................................. 54-75509
Jul. 23, 1979 [JP] Japan .................................. 54-93519

[51] Int. Cl.³ .......................................... G11C 11/40
[52] U.S. Cl. .................................................. 365/200
[58] Field of Search ..................... 365/200, 210; 371/8, 371/10

[56] References Cited

U.S. PATENT DOCUMENTS 3,753,235 8/1973 Dawghton et al. .................. 365/200
4,047,163 9/1977 Choate et al. ....................... 365/200

FOREIGN PATENT DOCUMENTS 2356167 5/1975 Fed. Rep. of Germany .
45-1417 1/1970 Japan .
50-116144 9/1975 Japan .
52-61933 5/1977 Japan .

OTHER PUBLICATIONS

G. Tadayuki, "Z80 to Dynamic RAM MK4116", Transistor, vol. 15, No. 9, 1978-9, pp. 215-224.

Primary Examiner—Joseph A. Popek
Attorney, Agent, or Firm—Staas & Halsey

[57] ABSTRACT

A semiconductor memory device (10), including a conventional redundancy memory array (12) therein, is disclosed. The redundancy memory array (12) is used for compensating data being stored in a defective memory cell (13') of main memory cells (11) located in the memory device (10). An addressing device (15) for specifying one of the memory cells, activates both the main memory cells (11) and the redundancy memory array (12), and at the same time, both a detecting device (16) for detecting whether or not an address information (AI) to be supplied to the addressing device (15) specifies the defective memory cell (13'), and a switching device (17) for selecting either one of the systems of the main memory cells (11) and the redundancy memory array (12), in accordance with a resultant determination of the detecting device (16), are activated. The switching device (17) is connected between a main data bus (DB$_m$), cooperating with the main memory cells (11), and a redundancy data bus (DB$_r$), cooperating with the redundancy memory array (12).

14 Claims, 7 Drawing Figures

SEMICONDUCTOR MEMORY DEVICE

DESCRIPTION

BACKGROUND OF THE INVENTION

The present invention relates to a semiconductor memory device and, more particularly, relates to a semiconductor memory device including at least one redundancy memory array therein.

A semiconductor memory device is mainly comprised of many memory cells arranged along both rows and columns in an orthogonal fashion. Each of the memory cells stores a respective bit of data. Each bit of data to be written or read is located at a corresponding memory cell which is specified by an address information. The address information determines both a row address and a column address so that the desired one of the memory cells can be accessed at the intersect portion of both the determined row and column addresses.

Generally, an undesired defect is often created in one of the great number of memory cells, during the manufacturing process of the memory device. It is, of course, obvious that the memory device cannot operate normally when the memory device includes such a defective memory cell therein. Therefore, such a memory device cannot be put into practical use, and such a memory device must be left out. However, it is not preferable, from an economical point of view, to leave out the manufactured memory device due to the presence of only one defective memory cell among a great number of memory cells.

In order to save such a defective memory device, the redundancy memory array is usually incorporated with the main memory cells. When said address information specifies a row memory array or a column memory array, including the defective memory cell, such defective row or column memory array is replaced by the redundancy memory array which contains a corrected memory cell with regard to the defective memory cell of the main memory cells.

A conventional semiconductor memory device, including such a redundancy memory array, is comprised of the main memory cells, an addressing means for specifying both the row memory array and the column memory array of the main memory cells, a detecting means for detecting whether or not the addressing means specifies the row or column memory array including the defective memory cell therein and a switching means for replacing the specified row or column memory array by the redundancy memory array, according to the result of the detecting means. Above all, the present invention refers specifically to an improvement of the switching means and the switching procedure. In the above mentioned conventional semiconductor memory device, first, the detecting means is activated for inspecting the address information to be applied to the addressing means, but, the addressing means is not yet activated; second, if the detecting means determines that the address information does not specify the row or column memory array including the defective memory cell, the addressing means starts being activated and accesses the specified memory cell; alternatively, if the detecting means determines that the address information specifies the row or column memory array, including the defective memory cell, the addressing means is not yet activated, but, the switching means activates the redundancy memory array in place of the defective memory array of the main memory cells and; last, the output data to be read is produced from the specified memory cell to a data output buffer circuit via a data bus or, if necessary, the input data to be written is supplied from a data input buffer circuit to the specified memory cell via the data bus.

Thus, the above mentioned memory device of the prior art has a shortcoming, in that the access time for reading or writing the data is long, and accordingly a high speed operation of the semiconductor memory device cannot be expected. This is because, a time for inspecting the address information, by means of the detecting means, must be inserted prior to each time the accessing operation for the main memory cells is carried out.

SUMMARY OF THE INVENTION

An object of the present invention is, therefore, to provide a semiconductor memory device, including a redundancy memory array therein, which has no shortcoming similar to the aforesaid shortcoming of such semiconductor memory device of the prior art, and accordingly, high speed operation of the semiconductor memory device, including the redundancy memory array therein, can be obtained.

According to the present invention, there is provided a semiconductor memory device, including a redundancy memory array therein, wherein both the main memory cells and the redundancy memory array can be accessed simultaneously by using the same address information, regardless of whether the address information specifies a defective memory cell. Then the data to be read, from the main memory cells, appears on a main data bus and, at the same time, corresponding data to be read from the redundancy memory array appears on a redundancy data bus. These main and redundancy data buses are connected via the switching means. The switching means selectively connects the main or redundancy data bus to the data output buffer circuit according to a result of the detecting means for inspecting whether the address information specifies a defective memory cell of the main memory cells. If the main memory cells are fabricated as an RAM (random access memory), the data to be written from the data input buffer circuit is selectively supplied to the main or redundancy data bus via the switching means under the control of the detecting means.

DESCRIPTION OF THE PREFERRED EMBODIMENT

The present invention will become more apparent from the detailed description of the preferred embodiments presented below, with reference to the accompanying drawings.

Figure 1:
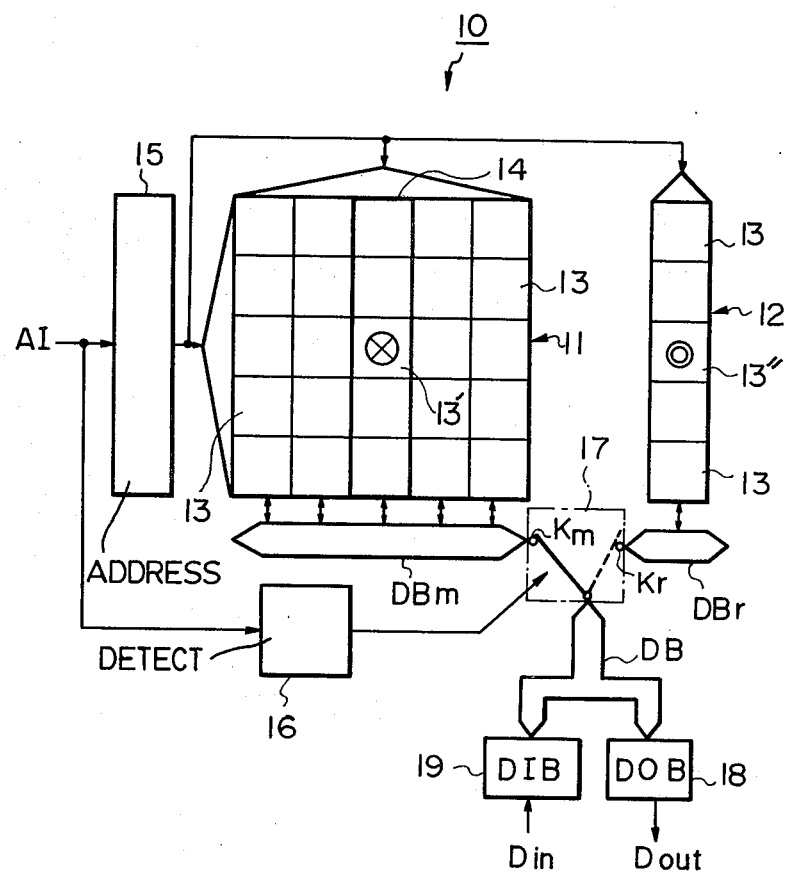
FIG. 1 is a block diagram schematically illustrating a basic embodiment according to the present invention.

Referring to FIG. 1, which is a block diagram schematically illustrating a basic embodiment according to the present invention, the reference numeral 11 represents main memory cells. The main memory cells 11 coordinates with a redundancy memory array 12. The memory cells 11 and the array 12 are comprised of a plurality of memory cells 13. In the main memory cells 11, the memory cells 13 are arranged along row memory arrays and column memory arrays in an orthogonal fashion. However, the redundancy memory array 12 is comprised of a single row memory array or a single column memory array (in this Figure, for example, a single column memory array is illustrated). If the main memory cells 11 contains a column memory array (or row memory array) 14 which includes a defective memory cell ($\times$) 13', the defective column memory array 14 is fabricated, in advance, as the redundancy memory array 12 which contains a corrected memory cell ($\bigcirc$) 13" therein. Accordingly, if the defective column memory array 14 (or a defective row memory array) is specified by an addressing means 15 in accordance with an address information AI to be supplied from, for example, a central processing unit (not shown), the specified defective column memory array 14 must be replaced by the redundancy memory array 12.

According to the present invention, a switching means 17 is located in the data buses. The data buses are comprised of a main data bus $DB_m$, cooperating with the main memory cells 11, and a redundancy data bus $DB_r$, cooperating with the redundancy memory array 12. A contact $K_m$ of the switching means 17 is connected to the bus $DB_m$ and a contact $K_r$ thereof is connected to the bus $DB_r$. The separated data buses $DB_m$ and $DB_r$ also create one of the features of the present invention.

If the addressing information AI specifies a normal column memory array and also a normal row memory array, normal data is produced on the data bus $DB_m$ and transferred to a data output buffer circuit (DOB) 18, via the contact $K_m$ of the switching means 17 and a data bus DB, so that an output data $D_{out}$ is obtained. Contrary to this, if the addressing information AI specifies a defective column memory array 14, the addressing means 15 specifies not only the array 14, but also the redundancy memory array 12, simultaneously, which fact is also another of the features of the present invention. In this case, both the defective data and the normal data are produced, simultaneously, on the data bus $DB_m$ and the data bus $DB_r$, respectively. Therefore, the contact $K_m$ of the switching means 17 is made to open and the contact $K_r$ thereof is made to close, so as to obtain only the normal data from the data bus $DB_r$. The switching operation of the contacts $K_m$ and $K_r$ is achieved by means of a detecting means 16. The detecting means 16 holds therein the same address information as the information AI regarding the defective column memory array 14 (or the defective row memory array) and always operates to compare the address information AI with the held address information regarding the defective memory array of the main memory cells 11. When both the address information sets coincide with each other, the detecting means 16 operates to switch the contact $K_m$ to the contact $K_r$.

If a semiconductor memory device 10 is fabricated as the RAM, an input data $D_{in}$ to be written is applied to the data bus $DB_m$ or $DB_r$, via a data input buffer circuit (DIB) 19, the data bus DB and the switching means 17. If the input data $D_{in}$ is data to be written in one of the memory cells 13 other than the defective memory cell 13', the detecting means 16 controls the switching means 17, so as to close the contact $K_m$ in accordance with the address information AI regarding the data $D_{in}$. Contrary to this, if the data $D_{in}$ is data to be written in the defective memory cell 13', the detecting means 16 controls the switching means 17 so as to close the contact $k_r$, so that the data $D_{in}$ is stored at the corresponding normal memory cell 13".

The semiconductor memory device 10 can overcome the previously mentioned shortcoming created by the prior art memory device. That is, the access time, achieved by the device 10, is shorter than that of the prior art device, and accordingly a high speed memory device can be obtained. The reason for this fact has already been explained, but will be mentioned again with reference to FIG. 1. In the prior art, the addressing means (corresponding to the means 15) is not activated even though the address information AI has already been applied thereto. That is, the addressing means cannot be activated until the detecting means (corresponding to the means 16) determines whether the memory cell 11 should be accessed or the memory array 12 should be accessed, through the operation of inspecting the address information AI. Thus, the time for carrying out such an inspection of the address information, expands the total access time of the prior art memory device. However, according to the present invention, such a time for inspecting the address information AI does not exist independently, but exists in parallel with a so-called real time operation for accessing both the memory cells 11 and the memory array 12, simultaneously.

Figure 2:
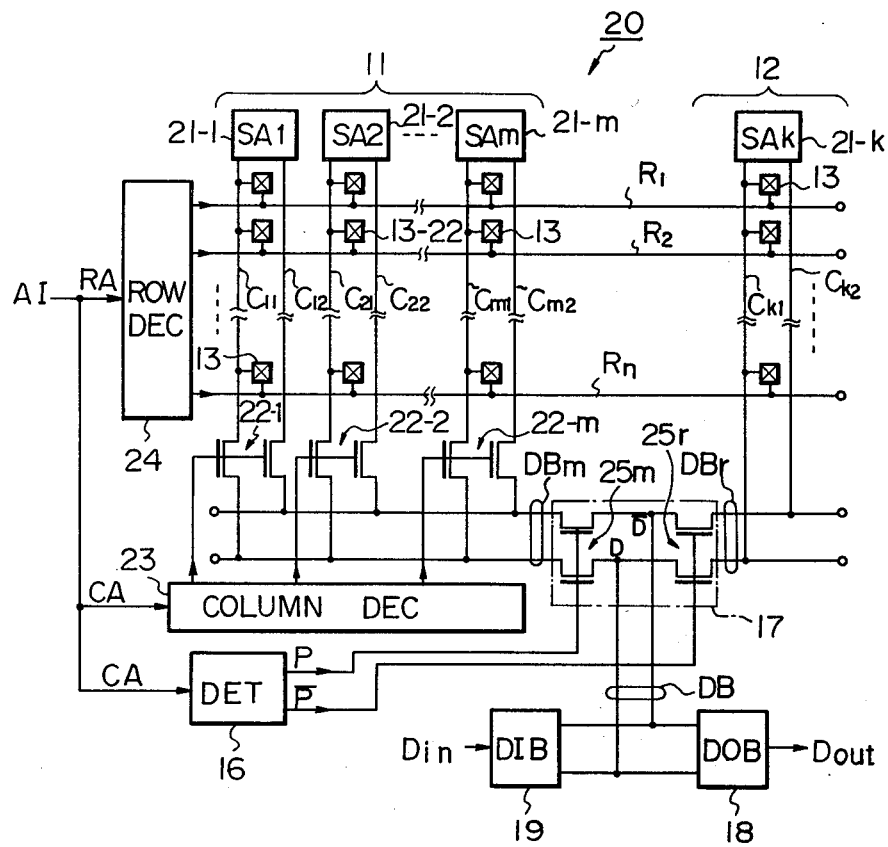
FIG. 2 illustrates a circuit diagram of a first embodiment, based on said the embodiment of FIG. 1, according to the present invention.

FIG. 2 illustrates a circuit diagram of a first embodiment, based on the basic embodiment of FIG. 1, according to the present invention. The members, represented by the same numerals and symbols as those of FIG. 1, are identical to each other. In FIG. 2, the reference numeral 20 represents a semiconductor memory device of the first embodiment. The reference symbols R1, R2 through Rn represent row lines, that is so-called word lines, the reference symbols C11, C12, C21, C22 through Cm1, Cm2 represent column lines, that is so-called bit lines, and a plurality of memory cells 13 are connected at every intersection point of these row and column lines. Each of these memory cells 13 may be fabricated by a dynamic memory element, such as a so-called single transistor cell. The single transistor cell is comprised of a single MOS-FET (metal-oxide semiconductor-field effect transistor) and a capacitor, such as shown in the U.S. Pat. No. 4,025,907. However, each of these memory cells 13 can also be fabricated by a static memory element. The dynamic memory element and the static memory element will be mentioned hereinafter when a second embodiment of the present invention is explained. At the ends of the pairs of the column lines, conventional sense amplifiers (SA1, SA2 SAm) 21-1, 21-2 through 21-m are connected. While, at the other ends of these column lines, conventional transfer gates 22-1, 22-2 through 22-m, made of, for example pairs of FETs, are connected. The column lines C11, C12 through Cm1 and Cm2 are connected to the main data bus $DB_m$ (see FIG. 1), via these transfer gates 22-1 through 22-m. The control gates of the FETs, comprising the transfer gates 22-1 through 22-m, are connected to a column decoder (COLUMN DEC) 23 for selecting one of the column lines (column memory arrays). Both the column decoder 23 and a row decoder (ROW DECODER) 24, as one body, form the aforesaid addressing device 15 of FIG. 1. The row decoder 24 functions to select one of the row lines (row memory arrays). As previously mentioned, the data to be read is, first, provided on the bus $DB_m$ and, then, obtained from, as the output data $D_{out}$, the data output buffer circuit 18, via the switching means 17 and the common bus DB. When, for example, the row line R2 becomes logic "1" and the voltage level of one of the column lines C21 and C22 becomes higher than that of the other column line, in accordance with the stored data in the memory cell 13-22, a flip-flop (not shown) of the sense amplifier 21-2 changes its status so as to amplify the difference of voltage levels between the column lines C21 and C22. The amplified difference of the voltage levels is transferred to the data bus $DB_m$ via the transfer gate 22-2, which is now made to open, and finally obtained, as the output data $D_{out}$.

The redundancy memory array 12 of FIG. 2 is fabricated as a column memory array, which also has column lines Ck1 and Ck2. At the end of these column lines, a sense amplifier (SAk) 21-k is connected, while, at the other end thereof, the aforesaid redundancy data bus $DB_r$ (see FIG. 1) is connected. The buses $DB_m$ and $DB_r$ are selectively connected to the common data bus DB, via the switching means 17, under control of the detecting means 16. The detecting means 16 produces both a first output P and a second output $\overline{P}$ having an inverted level of the output P. The levels of the outputs P and $\overline{P}$ vary in accordance with the address information AI. Thus, in the switching means 17, either one of a transfer gate $25_m$ or a transfer gate $25_r$ opens, selectively, according to the levels of the outputs P and $\overline{P}$.

As previously mentioned, the defective memory cell is often created during the manufacturing process of the memory device 20. Then, a corresponding column memory array of the main memory cells 11, containing a corrected memory cell, is formed as the memory array 12. At this time, the column address information of the above mentioned defective column memory array, is written in the detecting means 16. In normal operation, the detecting means 16 produces the outputs P having logic "1" and $\overline{P}$ having logic "0", and accordingly the common data bus DB is connected, not to the bus $Db_r$, but to the bus $DB_m$. However, if the detecting means 16 determines that the presented address information AI coincides with the address information written therein, the detecting means 16 produces the outputs P having logic "0" and $\overline{P}$ having logic "1", and accordingly, the common data bus DB is connected to the data bus $DB_r$, so as to replace the data, produced from the defective column memory array, by the data produced from the redundancy column memory array 12. The details of the detecting means 16 will be mentioned hereinafter.

Figure 3A:
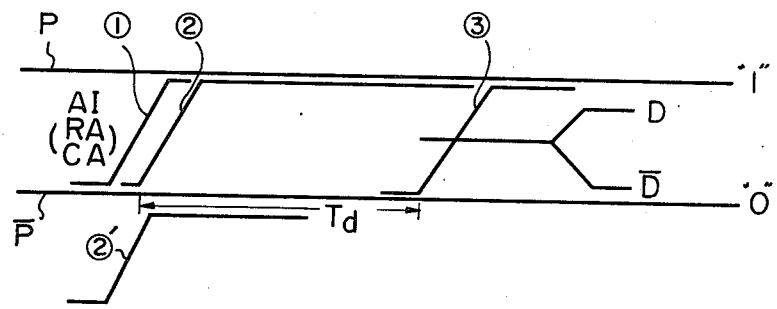
FIGS. 3A and 3B depict schematic timing charts, used for explaining the operation of a semiconductor memory device 20 shown in FIG. 2.
Figure 3B:
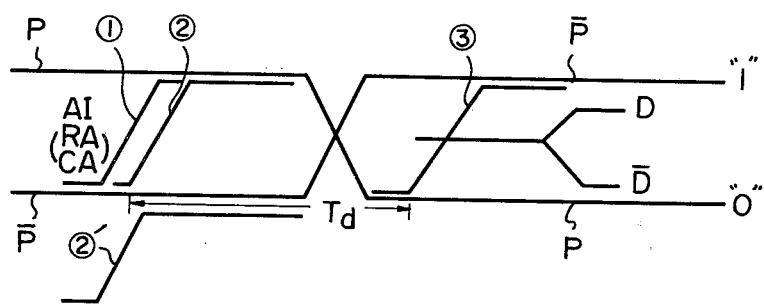

The above mentioned operation for reading the data will be clarified with reference to FIGS. 3A and 3B. FIG. 3A depicts schematic timing charts used for explaining a normal operation of the semiconductor memory device 20, while, FIG. 3B depicts schematic timing charts used for explaining an operation thereof when the redundancy memory array 12 is selected. Referring to both FIGS. 3A and 3B, first, the address information AI provides both the row address information RA and the column address information CA (see step ①). Second, the row decoder 24 is activated by the address information RA (see step ②) immediately after the occurrence of the step ①. Third, the column decoder 23 is activated by the address information CA (see step ③). It should be noted that, in the usual memory device, the row memory array and the column memory array are selected, not simultaneously, but sequentially one by one with some delay of time $T_d$. During the delay of the $T_d$, that is the activation of the row decoder 24, the detecting means 16 and the switching means 17 are activated (see step ②'). If the resultant determination of the detecting means 16 indicates that the column address information CA does not specify the defective column memory array, the outputs P and $\overline{P}$ from the detecting means 16 are left as they are (see P and $\overline{P}$ in FIG. 3A). Finally, the accessed data sets D and $\overline{D}$ (see FIGS. 2 and 3A) are produced from the circuit 18, as the output data $D_{out}$.

Contrary to the above, if the resultant determination of the detecting means 16 indicates that the column address information CA specifies a defective column memory array, the levels of the outputs P and $\overline{P}$ are exchanged, such as shown in FIG. 3B, and thereby the corrected data sets D and $\overline{D}$ are produced from the circuit 18.

Figure 4:
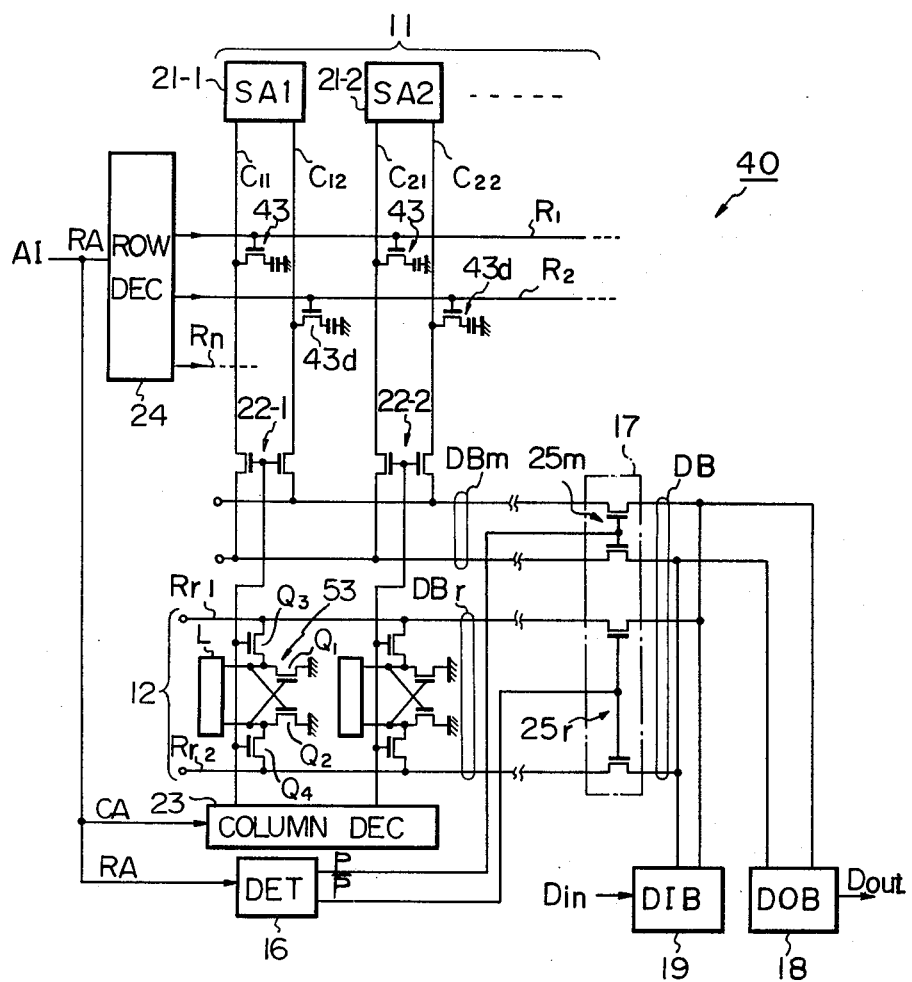
FIG. 4 illustrates a circuit diagram of a second embodiment, based on the basic embodiment of FIG. 1, according to the present invention.

FIG. 4 illustrates a circuit diagram of a second embodiment, based on the basic embodiment of FIG. 1, according to the present invention. The members, represented by the same reference numerals and symbols, are those of FIG. 2. In FIG. 4, the reference numeral 40 represents a semiconductor memory device of the second embodiment. Memory cells 43 and 43d comprising the main memory cells 11 are made of single transistor cells, each of which has an MOS-FET and a capacitor. The memory cells 43d are so-called dummy memory cells.

The redundancy memory array 12 of FIG. 4 is fabricated, not as a column memory array, as shown in the first embodiment, but as a row memory array. In the array 12, a plurality of memory cells 53 are arranged, such as shown in this FIG. 4. The memory cells 53 are not made of dynamic memory elements (cells), but of static memory elements (cells). Each of the static memory cells 53 is comprised of driver transistors $Q_1$, $Q_2$, a load L and gate transistors $Q_3$, $Q_4$. The gate transistors $Q_3$ and $Q_4$ are made to go ON and OFF by the corresponding one of the outputs from the column decoder 23. Row lines $R_{r1}$ and $R_{r2}$, also acting as the redundancy data bus $DB_r$, are connected or disconnected to both the data output buffer circuit 18 and data input buffer circuit 19, via the common data bus DB, under control of the transfer gate $25_r$ of the switching means 17. Similarly, the main data bus $DB_m$ is connected or disconnected to both circuits 18 and 19, via the bus DB, under control of the transfer gate $25_m$ of the switching means 17. These gates $25_m$ and $25_r$ are selectively made to go ON or OFF, according to the outputs P and $\overline{P}$ from the detecting means 16. In this case, the row address information of the defective row memory array, containing the defective memory cell therein, is written in the detecting means 16.

Figure 5:
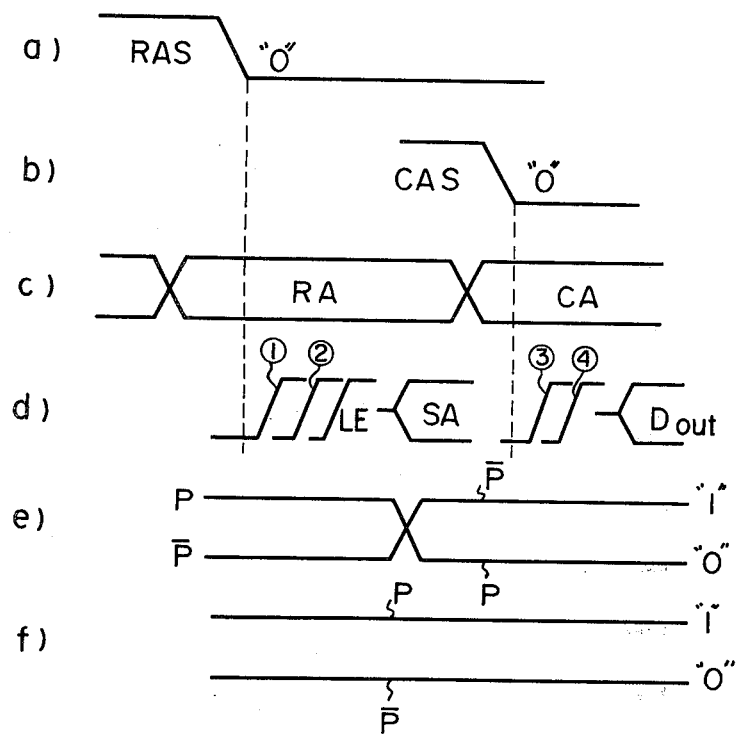
FIG. 5 depicts schematic timing charts, used for explaining the operation of a semiconductor memory device 40 shown in FIG. 4.

The operation of the semiconductor memory device 40 will be clarified with reference to FIG. 5. In FIG. 5, which depicts schematic timing charts used for explaining the operation thereof, the address information AI (see FIG. 4) sequentially provides, first, the row address information RA and, second, the column address information CA (see row c)). The operations for fetching the address information RA and CA, are started when a row address strobe signal RAS and a column address strobe signal CAS, become logic "0", respectively (see rows (a) and (b)). Then the row decoder 24 (FIG. 4) is activated according to the address information RA (see step ① or row (d)) and the voltage level of the corresponding row line increases (see step ② of row (d)). At the same time, the detecting means 16 (FIG. 4) starts the operation for determining whether or not the presented address information RA coincides with the defective row memory array. At the beginning of the operation for inspecting the address information RA, the logic of the outputs P and $\overline{P}$ are "1" and "0", respectively, as shown in rows (e) and (f).

When the voltage level of the row line becomes "H" (high), the sense amplifier (SA) is activated by a clock pulse LE (see row (d)), and one of the corresponding pair of column lines is caused to be the "H" level, while, the other thereof is caused to be the "L" level. As known from the aforesaid U.S. Pat. No. 4,025,907, in the single transistor cell type of memory cell, the column lines are precharged to a voltage level of "V" before the operation for read is commenced. Since the capacitance value of the dummy memory cell 43$d$ (FIG. 4) is selected to be one half of the capacitance value of the real memory cell 43 (FIG. 4), if the real memory cell 43 has a stored data "1" and the cell 43 is precharged to the voltage level of "V", the voltage level of the column line does not vary even though the real memory cell is specified and connected to this column line. On the other hand, when the column line is connected to the dummy memory cell 43$d$ which has been discharged, the voltage level of this column line is reduced to the level of "$V_1$" ($V_1 < V$). Thus, the outputs of the sense amplifier (SA), made of a flip-flop, change, at the real memory cell side, to OFF ("H" level) and change, at the dummy memory cell side, to ON ("L" level). However, since the difference of voltage levels, between the pair of the column lines, is very small, it takes a very long time to complete the changes (see SA of row (d)) of the outputs of the sense amplifier (SA). This is the shortcoming of the single transistor cell type of memory cell; but, this type memory cell has an advantage in that it is very simple in construction and enables a higher packing density.

Accordingly, the detecting means 16 (FIG. 4) and the switching means 17 (FIG. 4) can finish respective operation during the above mentioned long time for completing the changes of the outputs of the sense amplifier (SA) (see FIG. 5 rows (e) and (f)). In this case, the redundancy memory array 12 must finish its work very quickly by the time the column address strobe signal CAS (see row (b)) changes to logic "0". Therefore, each memory cell 53 (FIG. 4) of the redundancy memory array 12 is made of, not the single transistor cell type memory cell, but of a high speed static memory element, such as a flip-flop type memory cell. Thereafter, the column decoder 23 (FIG. 4) is activated according to the column address information CA (see step ③ of row (d)), and the desired data is provided on the data bus (see step ④ of row (d)). Finally, the output data $D_{out}$ is produced (see step "$D_{out}$" of row (d)) from the data output buffer circuit 18 (FIG. 4).

Figure 6:
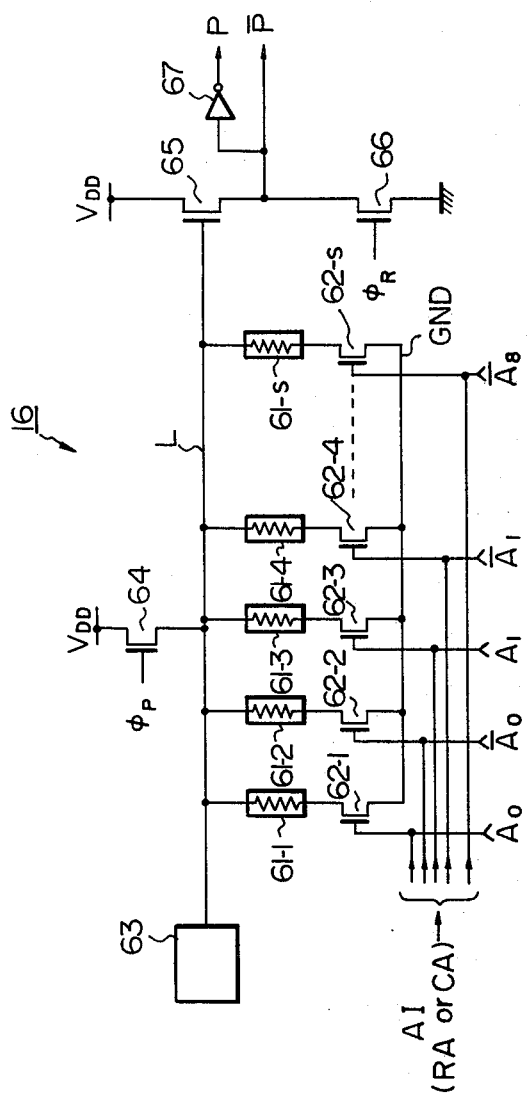
FIG. 6 is a circuit diagram illustrating one example of a detecting device 16.

FIG. 6 is a circuit diagram illustrating one example of the detecting means 16. In the detecting means 16, the reference numerals 61-1, 61-2, 61-3, 61-4 through 61-S represent fuse elements. FETs 62-1, 62-2, 62-3, 62-4 through 62-S are connected, in series, with the respective fuse elements. These series connected fuse elements and FETs are connected in parallel between a common signal line L and a ground line GND. Since the detecting means 16 is fabricated as a PROM (programmable read only memory), particular fuse elements have been melted away, in advance. That is, a very high power is supplied from a pad 63, which is located on the same single semiconductor chip for mounting the semiconductor memory device of the present invention. At the same time, particular FETs are made conductive, and accordingly, the corresponding particular fuse elements are melted away by the high power from the pad 63. The particular FETs are defined by an input address ($A_0$, $\overline{A}_0$, $A_1$, $\overline{A}_1$ ... $\overline{A}_8$) which is the same as the row address information (RA) or the column address information (CA), regarding the defective row or column memory array of the main memory cells 11.

Thus, the fabricated PROM, that is the detecting means 16, operates as follows. The common signal line L is precharged to a voltage level of about "$V_{DD}$" via an FET 64 sequentially in synchronism with a clock signal $\phi_P$. Then, if the address information AI, supplied to the PROM (16), specifies one of the normal address arrays, containing no defective memory cell, at least one of the pairs of the fuse element and the FET becomes conductive. Therefore, the level of the line L is reduced to the ground level (GND) (at this time, the FET 64 is made to go OFF by the clock signal $\phi_P$). Thus, an FET 65 is not made to go ON, and, on the other hand, the ground voltage level, supplied through an FET 66 (which is now made conductive by a clock signal $\phi_R$), causes the output $\overline{P}$ to become the logic "0" and the output P the logic "1", via an inverter 67. In this case, the transfer gate 25$_m$ (see FIGS. 2 and 4) is opened.

However, if the address information AI, supplied to the PROM (16), specifies the defective memory array, since all the FETs connected to the respective fuse elements which have been melted away are made conductive, and all the remaining FETs connected to the respective fuse elements which are not melted away are made non-conductive, the voltage level of nearly "$V_{DD}$" on the line L, causes the FET 65 to be conductive, and accordingly the output $\overline{P}$ becomes logic "1" and the output P becomes logic "0" (the FET 66 is now non-conductive). In this case, the transfer gate 25$_r$ (see FIGS. 2 and 4) is opened.

The above mentioned explanations are made by taking, as an example, a case where only one defective memory cell exists in the main memory cells 11 for the purpose of facilitating the understanding of the present invention. However, it should be understood that the present invention can also be applicable to a memory device containing two or more defective memory cells or one or more defective memory arrays therein. Further, the above mentioned explanations are made by taking as an example a case where the redundancy memory array 12 is fabricated as either one of the row or column memory arrays. However, it should be understood that the present invention may be applicable to a memory device which cooperates with both the redundancy row and column memory arrays.

I claim:

1. A semiconductor memory device, operatively connectable to receive address information including both row and column address information, comprising:

a data bus;
a main memory array, operatively connected to said data bus and having main memory cells, a main row memory array and a main column memory array, one of the main memory cells is a defective memory cell;
a redundancy memory array, operatively connected to said data bus, being associated with said main memory cells and containing therein a corrected memory cell corresponding to said defective memory cell contained in said main memory cells;
addressing means, operatively connected to said main memory cells and said redundancy memory array, and operatively connectable to receive the address information, for specifying said main memory array containing a desired memory cell in dependence upon the address information, said addressing means comprising a row decoder operatively connected to said main memory array, and a column decoder operatively connected to said main memory array, for specifying the main row memory array and the main column memory array of said main memory array, and the row address information being applied to said row decoder and column address information being applied to said column decoder;
detecting means, operatively connected to receive the address information, for detecting whether or not said address information specifies said defective memory cell;
switching means, operatively connected to said data bus and said detecting means, for selecting one of said main memory array and said redundancy memory array, in dependence upon a resultant determination of said detecting means;
a data input buffer circuit operatively connected to said data bus; and
a data output buffer circuit operatively connected to said data bus;
so as to read true data, via said data bus, from said data output buffer circuit or to write true data, via said data bus, from said data input buffer circuit, said data bus comprising:
a main data bus operatively connected to said main memory array and said main memory cells therein;
a redundancy data bus operatively connected to said redundancy memory array; and
a common bus operatively connected to said data input buffer circuit and said data output buffer circuit;
said switching means operatively connected between said main data bus and said redundancy data bus, so that either one of these data buses is selectively connected by said switching means, via said common bus, to said data output buffer circuit or said data input buffer circuit; and
said addressing means specifying both said main memory array having said main memory cells and said redundancy memory array, simultaneously, said switching means being activated in parallel with the operation of said addressing means.

2. A semiconductor memory device as set forth in claim 1, wherein said redundancy memory array comprises a redundancy column memory array and wherein specified memory cells of both the main row memory array and said redundancy memory array are accessed by said row decoder, simultaneously.

3. A semiconductor memory device as set forth in claim 2, wherein said detecting means and said switching means are activated, in dependence upon said column address information.

4. A semiconductor memory device as set forth in claim 1, wherein said memory cells and said redundancy memory array comprise dynamic memory elements.

5. A semiconductor memory device as set forth in claim 1, wherein said main memory cells comprise dynamic memory elements and said redundancy memory array comprises static memory elements.

6. A semiconductor memory device as set forth in claim 1,
wherein said detecting means comprises a programmable read only memory, operatively connected to said switching means and operatively connectable to receive address information,
wherein an address of data to be written is defined by said column address information and specifies the column memory array containing said defective memory cell therein, and
wherein said programmable read only memory activates said switching means when the corresponding column address information is applied to said programmable read only memory.

7. A semiconductor memory device as set forth in claim 1, wherein said main memory cells and said redundancy memory array comprise static memory elements.

8. A semiconductor memory device operatively connectable to receive address information, comprising:
a data bus;
a main memory array, operatively connected to said data bus and having main memory cells, one of which is a defective memory cell said main memory array also includes a main column memory array and a main row memory array;
a redundancy memory array, operatively connected to said data bus, being associated with said main memory cells and containing therein a corrected memory cell corresponding to said defective memory cell contained in said main memory cells, said redundancy memory array also includes a redundancy row memory array;
addressing means, operatively connected to said main memory cells and said redundancy memory array, and operatively connectable to receive the address information, for specifying said main memory array containing a desired memory cell, in dependence upon the address information, said addressing means comprising a row decoder and a column decoder for specifying the main row memory array and the main column memory array of said main memory array;
detecting means, operatively connectable to receive the address information, for detecting whether said address information specifies said defective memory cell;
switching means, operatively connected to said data bus and said detecting means, for selecting one of said main memory array and said redundancy memory array in dependence upon a resultant determination of said detecting means;
a data input buffer circuit operatively connected to said data bus; and
a data output buffer circuit operatively connected to said data bus;

so as to read true data, via said data bus, from said data output buffer circuit or to write true data, via said data bus, from said data input buffer circuit, said data bus comprising a main data bus operatively connected to said main memory array and said main memory cells therein;

a redundancy data bus operatively connected to said redundancy memory array; and a common bus operatively connected to said data input buffer circuit and said data output buffer circuit;

said switching means operatively connected between said main data bus and said redundancy data bus, so that either one of these data buses is selectively connected by said switching means, via said common bus, to said data output buffer circuit or said data input buffer circuit; and said addressing means specifying both said main memory array having said main memory cells and said redundancy memory array, simultaneously, said switching means being activated in parallel with the operation of said addressing means, and said address information sequentially provides, first, the row address information to be applied to said row decoder and then the column address information to be applied to said column decoder.

9. A semiconductor memory device as set forth in claim 8, wherein specified memory cells of both the main column memory array and said redundancy row memory array are accessed by said column decoder, simultaneously.

10. A semiconductor memory device as set forth in claim 9, wherein said detecting means and said switching means are activated, in dependence upon said row address information, during the activation of said row decoder, in dependence upon said row address information, and until said column address information is provided again.

11. A semiconductor memory device as set forth in claim 8, wherein said detecting means comprises a programmable read only memory, operatively connected to said switching means and operatively connectable to receive address information, an address of data to be written is defined by said row address information and specifies the row memory array containing said defective memory cell therein, and the programmable read only memory activates said switching means when the corresponding row address information is applied to said programmable read only memory.

12. A semiconductor memory device as set forth in claim 6 or 11,
wherein said programmable read only memory generates a first output and a second output having an inverted level with respect to said first output,
wherein said switching means comprises a first pair of field effect transistors operatively connected to said main data bus and said common data bus and a second pair of field effect transistors operatively connected to said redundancy data bus and said common data bus, and
wherein said first and second pairs of field effect transistors are made to go ON and OFF alternatively in dependence upon the first output and the second output having the inverted level of said first output, both outputs being generated by said programmable read only memory, simultaneously.

13. A semiconductor memory device, operatively connectable to receive an address signal, comprising:

a main memory array including a main row memory array and a main column memory array, and having therein a potentially defective memory cell having a main memory defective cell address;

a redundancy column memory array having therein a redundant memory cell for replacing said potentially defective memory cell of said main column memory array;

decoding means, operatively connected to said main memory array and said redundancy column memory array, and operatively connectable to receive the address signal, for decoding said address signal and for specifying a memory cell to be accessed in said main memory array and said redundancy column memory array;

detecting means, operatively connectable to receive the address signal, for generating a switching signal when the address signal corresponds to the main memory defective cell address; and switching means, operatively connected to said detecting means, said main memory array and said redundancy column memory array, for switching between said main memory array and said redundancy column memory array in dependence upon the switching signal and for passing therethrough data to be stored in or retrieved from said semiconductor memory device, said switching means selecting said redundancy column memory array for storage and retrieval when the address signal specifies the main memory defective cell address, and said decoding means and said detecting means receiving the address signal simultaneously, so that detection occurs coincident with decoding.

14. A semiconductor memory device, operatively connectable to receive an address signal, comprising:

a main memory array including a main column memory array and a main row memory array, and having therein a potentially defective memory cell having a main memory defective cell address;

a redundancy row memory array having therein a redundant memory cell for replacing said potentially defective memory cell of said main row memory array;

decoding means, operatively connected to said main memory array and said redundancy row memory array and operatively connectable to receive the address signal, for decoding said address signal and for specifying a memory cell to be accessed in said main memory array and said redundancy row memory array;

detecting means, operatively connectable to receive the address signal, for generating a switching signal when the address signal corresponds to the main memory defective cell address; and switching means, operatively connected to said detecting means, said main memory array and said redundancy row memory array, for switching between said main memory array and said redundancy row memory array in dependence upon the switching signal and for passing therethrough data to be stored in or retrieved from said semiconductor memory device, said switching means selecting said redundancy row memory array for storage and retrieval when the address signal specifies the main memory defective cell address, and said decoding means and said detecting means receiving the address signal simultaneously, so that detection occurs coincident with decoding.

* * * * *

UNITED STATES PATENT AND TRADEMARK OFFICE
CERTIFICATE OF CORRECTION

PATENT NO. : 4,473,895
DATED : September 25, 1984
INVENTOR(S) : TAKEO TATEMATSU

It is certified that error appears in the above-identified patent and that said Letters Patent is hereby corrected as shown below:

Column 1, line 16, delete "an".

Column 2, line 9, delete "a".

Column 5, line 51, change "$Db_r$" to --$DB_r$--.

Column 7, line 3, change "row c))" to --row (c))--.

Column 11, line 4, after "comprising" add --:--.

Signed and Sealed this

Seventeenth Day of September 1985

[SEAL]

Attest:

Attesting Officer

DONALD J. QUIGG

*Commissioner of Patents and Trademarks—Designate*